United States Patent
Maehata (10) Patent No.: US 9,698,816 B2
(45) Date of Patent: Jul. 4, 2017

(54) SIGNAL PROCESSING DEVICE AND COMMUNICATION DEVICE

(71) Applicant: SUMITOMO ELECTRIC INDUSTRIES, LTD., Osaka-shi, Osaka (JP)

(72) Inventor: Takashi Maehata, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/307,044

(22) PCT Filed: Jan. 28, 2015

(86) PCT No.: PCT/JP2015/052284
§ 371 (c)(1),
(2) Date: Oct. 27, 2016

(87) PCT Pub. No.: WO2015/170486
PCT Pub. Date: Nov. 12, 2015

(65) Prior Publication Data
US 2017/0047942 A1    Feb. 16, 2017

(30) Foreign Application Priority Data

May 8, 2014   (JP) ................................ 2014-096752

(51) Int. Cl.
*H03M 3/00*   (2006.01)
*H03M 3/02*   (2006.01)
(Continued)

(52) U.S. Cl.
CPC ............... *H03M 3/30* (2013.01); *H03M 3/02* (2013.01); *H04L 27/00* (2013.01); *H04B 1/71637* (2013.01); *H04L 1/0003* (2013.01)

(58) Field of Classification Search
CPC ..... H03M 3/30; H04B 1/71637; H04L 1/0003
(Continued)

(56) References Cited

U.S. PATENT DOCUMENTS 8,566,265 B1 * 10/2013 Cruz-Albrecht ....... G06N 3/049
706/27
2008/0198939 A1   8/2008 Nakasha et al.
(Continued)

FOREIGN PATENT DOCUMENTS

JP    H11-225049 A    8/1999
JP    2008-205733 A   9/2008
(Continued)

OTHER PUBLICATIONS

Paramartha Indirayanti, et al., "Picosecond Pulse Generation with Nonlinear Transmission Lines in 90-nm CMOS for mm-Wave Imaging Applications", Electronics, Circuits and Systems (ICECS), 2012 19th IEEE International Conference, pp. 885-888.
(Continued)

*Primary Examiner* — Joseph Lauture
(74) *Attorney, Agent, or Firm* — Drinker Biddle & Reath LLP (57) ABSTRACT

Reduction in signal intensity of a harmonic component included in an output of a delta-sigma modulator is suppressed. A signal processing device includes: a delta-sigma modulator 11 that outputs a pulse signal; a first processor 12 that generates, from the pulse signal $P_O$ outputted from the delta-sigma modulator 11, a discontinuous pulse signal $P_C$ in which each of one-pulse sections in the pulse signal $P_O$ has a low level region on at least one of a rear end and a front end of the one-pulse section; and a second processor that generates a short-width pulse signal $P_S$ having a pulse width shorter than a pulse width of the discontinuous pulse signal $P_C$ generated by the first processor 12.

12 Claims, 10 Drawing Sheets

(51) Int. Cl.
*H04L 27/00* (2006.01)
*H04L 1/00* (2006.01)
*H04B 1/7163* (2011.01)

(58) Field of Classification Search
USPC .................. 341/143; 375/256, 295; 710/71
See application file for complete search history.

(56) References Cited

U.S. PATENT DOCUMENTS

2011/0084880 A1  4/2011  Sakai et al.
2013/0117477 A1  5/2013  Kim et al.

FOREIGN PATENT DOCUMENTS

| JP | 2013-081106 A | 5/2013 |
| JP | 2013-098976 A | 5/2013 |
| JP | 2014-014066 A | 1/2014 |
| WO | WO-2010/064723 A1 | 6/2010 |

OTHER PUBLICATIONS

Takashi Maehata, et al., "Digitally Enhanced Harmonic Transmitter of 1-bit Bandpass ΔΣ Modulator", IECE Technical Report Aug. 12, 2014 (Aug. 12, 2014) vol. 114, No. 179, pp. 11-14, SAT2014-27.

\* cited by examiner

SIGNAL PROCESSING DEVICE AND COMMUNICATION DEVICE

TECHNICAL FIELD

The present invention relates to a signal processing device including a delta-sigma modulator and to a communication device.

BACKGROUND ART

Patent Literature 1 indicates that a modulated wave is subjected to delta-sigma modulation by a band-pass delta-sigma modulator, and a quantized signal (pulse signal) outputted from the band-pass delta-sigma modulator is outputted as the modulated wave. According to Patent Literature 1, when the modulated wave is subjected to band-pass delta-sigma modulation, the sampling frequency is preferably sufficiently high with respect to the signal bandwidth of the modulated wave. Therefore, even if the frequency of the modulated wave (the frequency of a non-modulated wave) is high, the sampling frequency need not be increased so much.

Patent Literature 1 further indicates that a harmonic signal component included in the output of the delta-sigma modulator is utilized as well as a main signal component included in the output of the delta-sigma modulator. According to Patent Literature 1, by utilizing the harmonic signal component included in the output of the delta-sigma modulator, the sampling frequency of the delta-sigma modulator can be kept low.

CITATION LIST

Patent Literature

PATENT LITERATURE 1: Japanese Laid-Open Patent Publication No. 2013-81106

SUMMARY OF INVENTION

Technical Problem

The harmonic component included in the output of the delta-sigma modulator has a problem that the signal intensity thereof is reduced with an increase in frequency. In particular, a harmonic component having a frequency higher than the sampling frequency fs of the delta-sigma modulator has attenuation of 13.5 dB or more with respect to the main signal component. Therefore, the signal intensity of the harmonic component having the frequency higher than the sampling frequency fs of the delta-sigma modulator falls below one tenth of the signal intensity of the main signal component. This reduction in signal intensity is disadvantageous in utilizing the harmonic component.

It is desired to suppress reduction in signal intensity of the harmonic component included in the output of the delta-sigma modulator.

Solution to Problem

One aspect of the present invention is a signal processing device including: a delta-sigma modulator configured to output a pulse signal; a first processor configured to generate, from the pulse signal outputted from the delta-sigma modulator, a discontinuous pulse signal in which each of one-pulse sections in the pulse signal has a low level region on at least one of a rear end and a front end of the one-pulse section; and a second processor configured to generate a short-width pulse signal having a pulse width shorter than a pulse width of the discontinuous pulse signal generated by the first processor.

Advantageous Effects of Invention

According to the present invention, it is possible to suppress reduction in the signal intensity of the harmonic components included in the output of the delta-sigma modulator.

DESCRIPTION OF EMBODIMENTS

Hereinafter, preferred embodiments of the present invention will be described with reference to the drawings.

1. Outline of Embodiments (1) A signal processing device according to an embodiment includes: a delta-sigma modulator configured to output a pulse signal; a first processor configured to generate, from the pulse signal outputted from the delta-sigma modulator, a discontinuous pulse signal in which each of one-pulse sections in the pulse signal has a low level region on at least one of a rear end and a front end of the one-pulse section; and a second processor configured to generate a short-width pulse signal having a pulse width shorter than a pulse width of the discontinuous pulse signal generated by the first processor. By reducing the pulse width of the pulse signal outputted from the delta-sigma modulator, reduction in the signal intensity of a harmonic component included in the output from the delta-sigma modulator can be suppressed.

(2) The second processor includes a generator configured to generate the short-width pulse signal on the basis of a plurality of input pulse signals, the plurality of input pulse signals include the discontinuous pulse signal, and a delayed pulse signal obtained by delaying the discontinuous pulse signal, and the generator can generate the short-width pulse signal having a pulse width according to a delay amount of the delayed pulse signal. In this case, a short-width pulse signal having a pulse width according to the delay amount of the delayed pulse signal can be generated. Therefore, the pulse width of the short-width pulse signal can be easily set by setting of the delay amount.

(3) One of the discontinuous pulse signal and the delayed pulse signal can be inverted with respect to the other pulse signal. Since the one pulse signal is inverted with respect to the other pulse signal, generation of the short-width pulse signal is facilitated.

(4) Preferably, the second processor further includes a first transmission line configured to provide the discontinuous pulse signal to the generator and a second transmission line configured to provide the delayed pulse signal to the generator, and the second transmission line has a line length larger than that of the first transmission line. In this case, since the second transmission line is longer than the first transmission line, the discontinuous pulse signal transmitted through the second transmission line becomes a delayed pulse signal.

(5) The second transmission line is preferably configured to have a variable line length. In this case, the pulse width of the short-width pulse signal can be made variable.

(6) Preferably, the second processor further includes a first transmission line configured to provide the discontinuous pulse signal to the generator and a second transmission line configured to provide the delayed pulse signal to the generator, and the second transmission line has a delay element. In this case, the delay element can cause the discontinuous pulse signal transmitted through the second transmission line to be a delayed pulse signal.

(7) The second processor preferably includes a step-recovery diode to which the discontinuous pulse signal generated by the first processor is provided. In this case, the delay element can cause the discontinuous pulse signal transmitted through the second transmission line to be a delayed pulse signal.

(8) Preferably, the second processor includes a transmission line to which the discontinuous pulse signal generated by the first processor is provided, and the transmission line is a non-linear transmission line configured to shorten the pulse width of the discontinuous pulse signal provided thereto. In this case, the transmission line can cause the discontinuous pulse signal to be a delayed pulse signal.

(9) The pulse width of the short-width pulse signal generated by the second processor is preferably larger than or equal to 1/10 of the pulse width of the pulse signal outputted from the delta-sigma modulator. In this case, the signal component can be prevented from becoming too small.

(10) A signal processing device according to an embodiment includes: a delta-sigma modulator configured to output a pulse signal; a first processor configured to generate, from the pulse signal outputted from the delta-sigma modulator, a discontinuous pulse signal in which each of one-pulse sections in the pulse signal has a low level region on at least one of a rear end and a front end of the one-pulse section; and a second processor. The second processor includes a generator configured to generate a short-width pulse signal, a first transmission line configured to provide the discontinuous pulse signal to the generator, and a second transmission line configured to provide a delayed pulse signal obtained by delaying the discontinuous pulse signal to the generator. The generator generates the short-width pulse signal on the basis of the discontinuous pulse signal and the delayed pulse signal. The second transmission line has a line length larger than that of the first transmission line.

(11) A communication device according to an embodiment is a communication device including the signal processing device according to any of above (1) to (10).

2. Details of Embodiments 2.1 Communication Device

Figure 1:
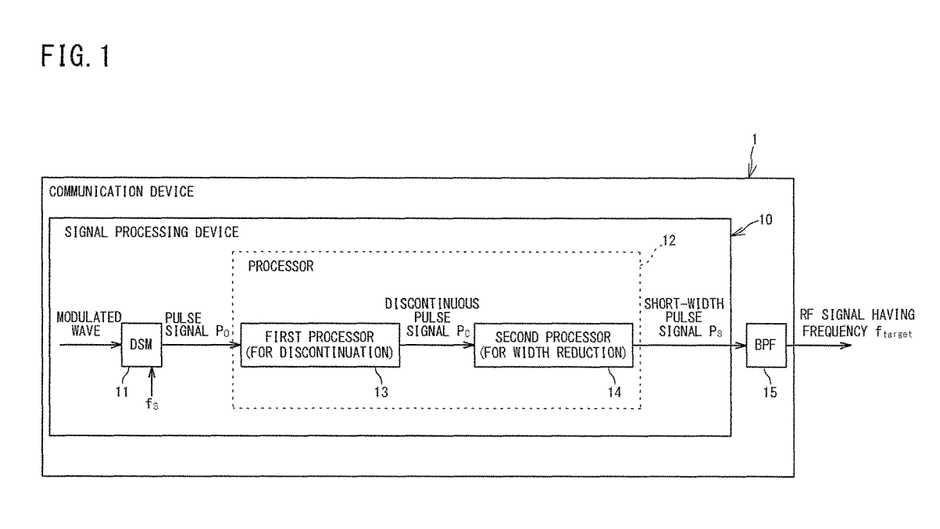
FIG. 1 is a configuration diagram of a communication device.

FIG. 1 shows a communication device 1. The communication device 1 includes a signal processing device 10, and a band-pass filter (analog band-pass filter) 15. The communication device 1 outputs a modulated signal obtained by modulating a baseband signal. The modulated signal is a radio signal (RF signal), for example. The signal outputted from the communication device 1 is a signal (communication signal) to be used for communication. The communication signal in this embodiment is an RF signal having a carrier wave frequency $f_{target}$.

Meanwhile, a signal (short-width pulse signal $P_S$) outputted from the signal processing device 10 includes, in addition to the RF signal having the carrier wave frequency $f_{target}$, signals of other frequencies. The band-pass filter 15 allows the signal near the frequency (in this case, $f_{target}$) desired to be outputted as the communication signal to pass therethrough, and prevents the signals of the other frequencies from passing therethrough. It is noted that the communication device 1 may output the signal (short-width pulse signal $P_S$) outputted from the signal processing device 10 without through band-pass filter 15.

2.2 Signal Processing Device

The signal processing device 10 includes a band-pass delta-sigma modulator 11, and a processor 12. The signal processing device 10 performs primary modulation such as digital orthogonal modulation on a baseband signal (e.g., an IQ baseband signal) to generate a modulated digital signal (digital RF signal). The modulated digital signal has a carrier wave frequency $f_0$. The signal processing device 10 provides the generated modulated digital signal to the delta-sigma modulator 11. The primary modulation is not limited to the orthogonal modulation. Any modulation that modulates the baseband signal according to the carrier wave (frequency $f_0$) may be adopted.

The delta-sigma modulator 11 performs delta-sigma modulation on the RF signal as an input signal to output a pulse signal (quantized signal) $P_O$. The sampling frequency (data rate) $f_S$ of the delta-sigma modulator 11 is set to be higher than the carrier wave frequency $f_0$ of the modulated signal to be inputted to the delta-sigma modulator 11 ($f_0 < f_S$). The relationship between $f_{target}$ and $f_0$, $f_S$ will be described later.

Figure 2:
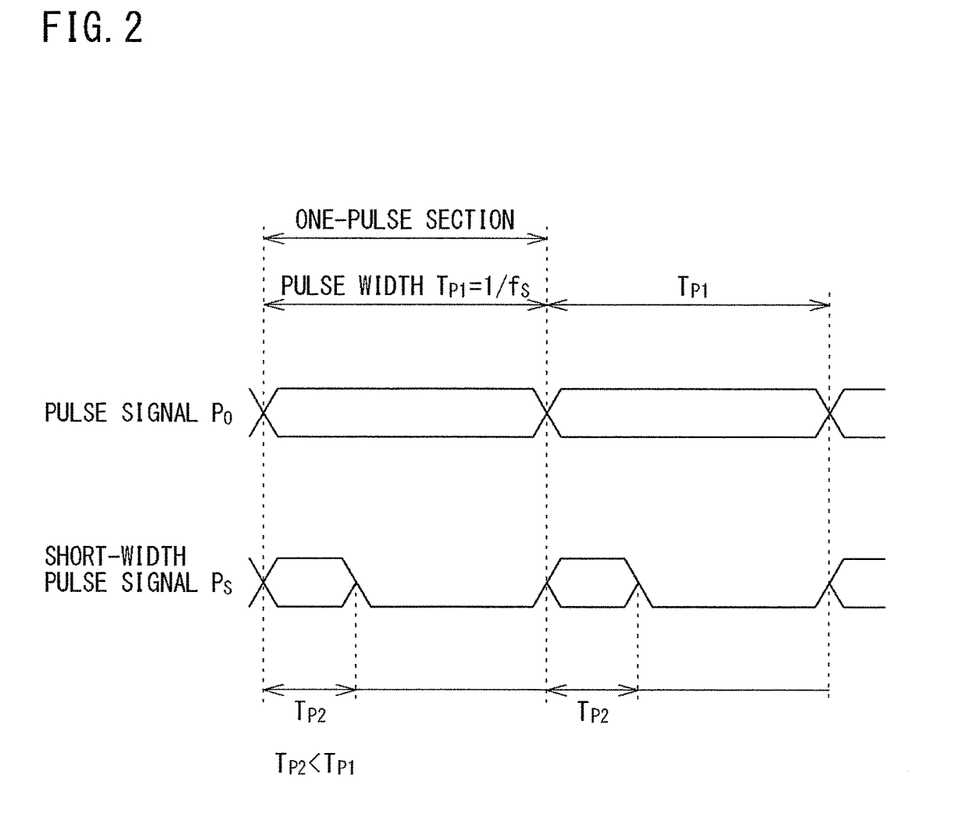
FIG. 2 is an illustrative diagram of a short-width pulse signal.

On the basis of the pulse signal (original pulse signal) $P_O$ generated by the delta-sigma modulator 11, the processor 12 generates a short-width pulse signal $P_S$ having a pulse width shorter than that of the original pulse signal $P_O$. Assuming that the pulse width (width of a one-pulse section) of the original pulse signal $P_O$ outputted from the delta-sigma modulator 11 is $T_{P1}$ and the pulse width of the short-width pulse signal $P_S$ is $T_{P2}$, $T_{P2}$ is shorter than $T_{P1}$ as shown in FIG. 2. In the original pulse signal $P_O$, the entirety of each one-pulse section has either a high level or a low level, and the pulse width (width of the one-pulse section) $T_{P1}$ is equal to $1/f_S$. On the other hand, in the short-width pulse signal $P_S$, a pulse is present only on the front side of each one-pulse section, and the rear side of each one-pulse section is a low level region. It is noted that the data rate of the short-width pulse signal $P_S$ remains at fs. In addition, the short-width pulse signal $P_S$ may have the low level region on the front side of each one-pulse section.

The processor 12 includes a first processor 13 and a second processor 14. The first processor 13 performs a discontinuation process in which at least one of the rear end and the front end of each one-pulse section in the pulse signal $P_O$ outputted from the delta-sigma modulator 11 is made a low level region.

The discontinuation process is preprocessing of a width reduction process to be performed by the second processor 14 (it is noted that the discontinuation process is also a width reduction process for a pulse). The discontinuation process is a process of separating the plurality of continuous one-pulse sections from each other with the low level regions so as to prevent continuation of the high level in the continuous one-pulse sections. Even in the case where the high level continues in the original pulse signal $P_O$, the discontinuation process provides the low level regions that separate the one-pulse sections from each other, whereby continuation of the high level is prevented. The pulse signal generated by the discontinuation process is referred to as a discontinuous pulse signal.

In the discontinuation process according to the present embodiment, each of the low level regions that separate the one-pulse sections from each other is provided at the rear side (rear end) of each one-pulse section. However, each low level region may be provided at the front side (front end) of each one-pulse section, or may be provided at both the rear side (rear end) and the front side (front end) of each one-pulse section.

The second processor 14 performs a width reduction process of further reducing the pulse width of the discontinuous pulse signal $P_C$ generated in the discontinuation process of the first processor 13. The width reduction process makes the length (pulse width) of each high level portion included in the discontinuous pulse signal $P_C$ shorter than the pulse width of the discontinuous pulse signal $P_C$. Therefore, the pulse width $T_{P2}$ of the short-width pulse signal $P_S$ generated by the width reduction process is shorter than the pulse width $T_{P1}$ of the original pulse signal $P_O$. The short-width pulse signal $P_S$ generated by the width reduction process is outputted from the signal processing device 10, and is outputted from the communication device 1 through the band-pass filter 15 (according to need).

2.3 Harmonic Component Included in Output of Delta-Sigma Modulator

Figure 3A:
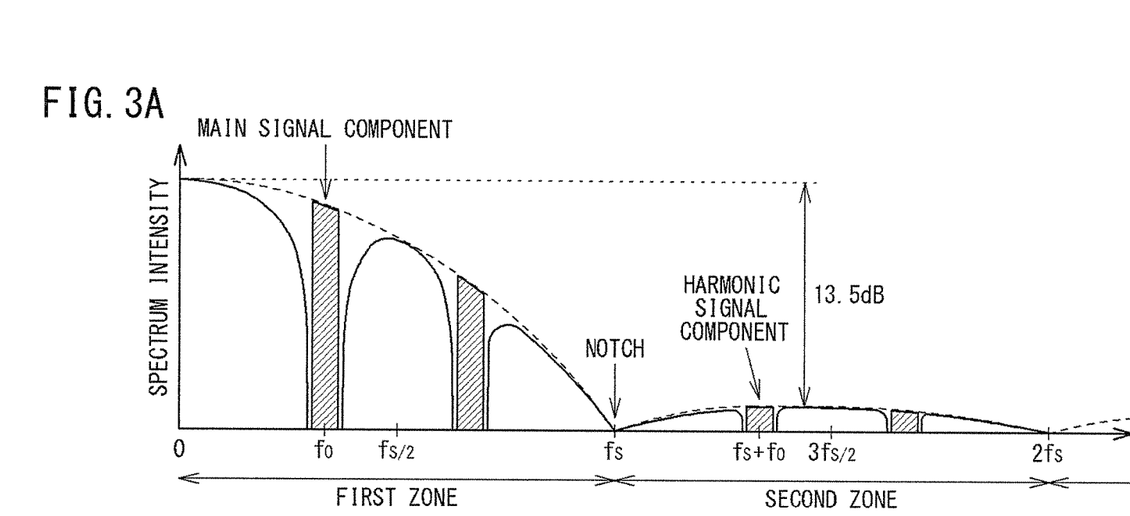
FIG. 3A shows a frequency spectrum of an original pulse signal.
Figure 3B:
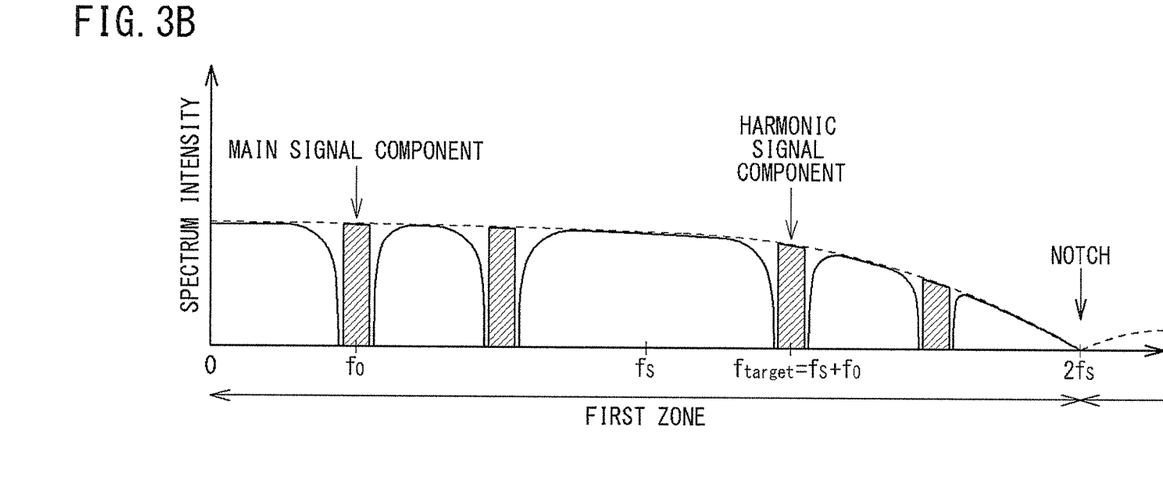
FIG. 3B shows a frequency spectrum of the short-width pulse signal.

FIG. 3A shows the frequency spectrum of the original pulse signal $P_O$, and FIG. 3B shows the frequency spectrum of the short-width pulse signal $P_S$.

The original pulse signal $P_O$ has a main signal component at the carrier wave frequency $f_0$ of the modulated signal to be inputted to the delta-sigma modulator 11. Thus, although the signal $P_O$ outputted from the delta-sigma modulator 11 is a pulse signal (digital signal), the signal $P_O$, when regarded as an analog signal, includes, as a signal component, the modulated signal (RF signal) inputted to the delta-sigma modulator 11.

The original pulse signal $P_O$ includes not only the main signal component (frequency $f_0$) but also a harmonic signal component caused by aliasing. The harmonic signal component appears at $n \times f_S + f_0$ (n: an integer having an absolute value of 1 or more). The sampling frequency $f_S$ of the delta-sigma modulator 11 needs to be higher than the frequency $f_0$ of the modulated signal to be inputted thereto. Therefore, in the case where the main signal component (frequency $f_0$) is the communication signal (frequency $f_{target}$) to be outputted from the communication device 1, if the frequency of the communication signal is, for example, 2 GHz, the sampling frequency $f_S$ has to be higher than 3 GHz (data rate=3 Gb/S). That is, the operation speed of the delta-sigma modulator 11 and the operation speed of the signal processing device 10 including the delta-sigma modulator 11 have to be higher than 3 GHz, resulting in an increase in the cost of the signal processing device 10.

However, in the case where the harmonic signal component (e.g., frequency $f_S + f_0$) is the communication signal (frequency $f_{target}$) to be outputted from the communication device 1, if the frequency of the communication signal is, for example 3 GHz, the sampling frequency $f_S$ may be lower than 3 GHz (data rate=3 Gb/S), for example, may be 2 GHz. In this case, assuming that the frequency $f_0$ of the carrier wave of the modulated signal to be inputted to the delta-sigma modulator 11 is 1 GHz, the harmonic signal component ($f_{target}=f_S+f_0$) can be set to 3 GHz. Thus, by utilizing the harmonic signal component, the operation speed of the signal processing device 10 can be kept lower than the desired communication frequency $f_{target}$, whereby cost reduction can be achieved.

However, as shown in FIG. 3A, the signal intensity of the harmonic signal component (e.g., frequency $f_S+f_0$) is significantly lower than that of the main signal component (frequency $f_0$). When the pulse width $T_{P1}$ is $1/f_S$ as in the original pulse signal, the signal component and the noise component are gradually reduced from the frequency of 0 toward the frequency $f_S$, and a notch in which the component intensity becomes zero occurs at the frequency $f_S$. In this embodiment, the range from the frequency of 0 to the frequency $f_S$ is referred to as a first zone. When the frequency exceeds the first zone and further increases, the component intensity turns to increase again. However, at $2f_S$, a notch occurs in which the component intensity becomes zero again. In this embodiment, the range from the frequency $f_S$ to the frequency $2f_S$ is referred to as a second zone. The signal intensity of the harmonic signal component in the second zone is about 13.5 dB attenuated with respect to the signal intensity of the main signal component in the first zone. Moreover, the signal intensity of the harmonic signal component generated in the frequency region higher than or equal to $2f_S$ is lower than that of the harmonic signal component in the second zone.

The frequency at which the notch occurs depends on the pulse width $T_{P1}$. When the pulse width $T_{P1}$ is $1/f_S$, the notch occurs at an integer multiple of the data rate (sampling frequency) $f_S$. However, since the frequency at which the notch occurs depends on the pulse width, even if the data rate (sampling frequency) is $f_S$, the frequency at which the notch occurs becomes higher as the pulse width becomes smaller. For example, in the case where the pulse width $T_{P2}$ of the short-width pulse signal $P_S$ is ½ of $T_{P1}$, the lowest frequency at which a notch occurs is $2f_S$ as shown in FIG. 3B. That is, the first zone is extended to a range from the frequency of 0 to the frequency $2f_S$.

As a result, the frequency (e.g., $f_S+f_0$) of the harmonic signal component that occurs in the frequency region higher than the frequency $f_S$ is also included in the first zone. Assuming that n is an integer not smaller than 2, the component intensity in the n-th zone is significantly reduced as compared to the component intensity in the first zone. However, by including the harmonic signal in the first zone, reduction in signal intensity of the harmonic signal component can be suppressed. Since the first zone is increased as the pulse width $T_{P2}$ of the short-width pulse signal $P_S$ is reduced, the harmonic component of the higher frequency can be advantageously included in the first zone as the pulse width $T_{P2}$ is reduced. Accordingly, the pulse width $T_{P2}$ of the short-width pulse signal $P_S$ is preferably smaller than ½ of the pulse width $T_{P1}$ of the original pulse signal $P_O$, and more preferably smaller than ⅓ of the pulse width $T_{P1}$.

On the other hand, if the pulse width $T_{P2}$ of the short-width pulse signal $P_S$ is too small, the signal energy might be reduced. Therefore, in terms of preventing reduction in the signal energy, the pulse width $T_{P2}$ of the short-width pulse signal $P_S$ is preferably larger than or equal to 1/10 of the pulse width $T_{P1}$ of the original pulse signal $P_O$. Even when the pulse width $T_{P2}$ of the short-width pulse signal $P_S$ is too small, reduction in signal energy can be prevented by making the pulse height of the short-width pulse signal $P_S$ higher than that of the original pulse signal $P_O$.

2.4 Discontinuation Process

Figure 4:
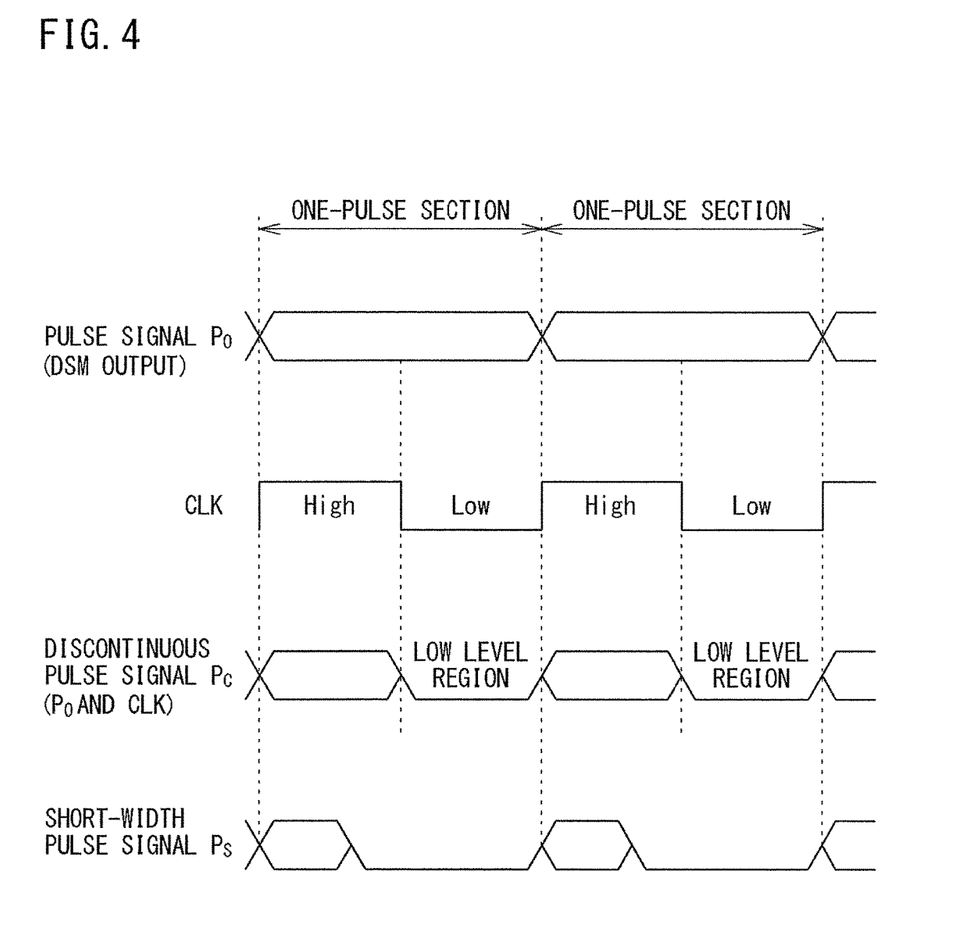
FIG. 4 is an illustrative diagram of a discontinuation process.

FIG. 4 shows a specific example of a discontinuation process performed by the first processor 13. In the discontinuation process according to the present embodiment, an AND (logical conjunction) operation is performed between the original pulse signal $P_O$ and a clock CLK having a rate twice the data rate $f_S$ of the original pulse signal $P_O$. Thereby, a discontinuous pulse signal $P_C$ is generated in which a pulse remains in the first half of the original pulse signal $P_O$, and the second half of the original pulse signal $P_O$ becomes a low level region. It is noted that, when "High" and "Low" of the clock CLK are inverted, a discontinuous pulse signal $P_C$ is generated in which a pulse remains in the second half of the original pulse signal $P_O$, and the first half of the original pulse signal $P_O$ becomes a low level region.

2.5 Width Reduction Process

2.5.1 First Example of Width Reduction Process (Utilizing Delay)

Figure 5A:
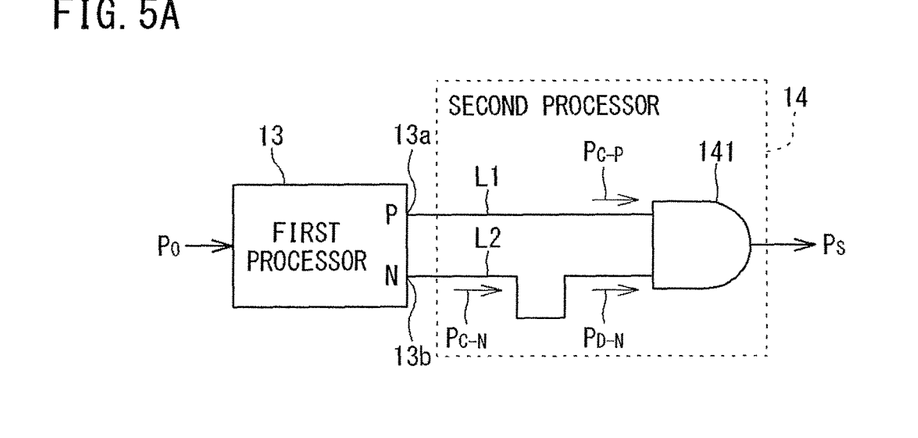
FIG. 5 shows a first example of a second processor.
Figure 5B:
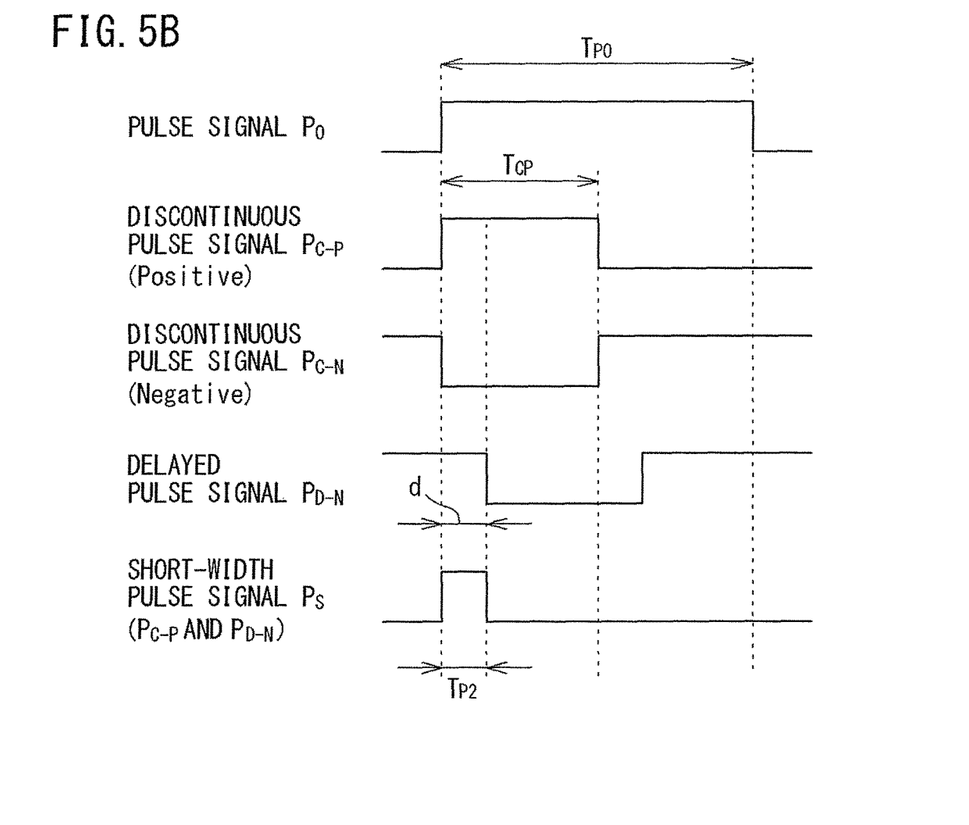

FIG. 5A shows a first example of a circuit constituting the second processor 14. The second processor 14 shown in FIG. 5 includes a generator 141, and a plurality of (two) transmission lines L1 and L2 connected to the generator 141.

The first processor 13 shown in FIG. 5A includes a non-inverting (Positive) output terminal 13a and an inverting (Negative) output terminal 13b as output terminals for outputting the discontinuous pulse signal $P_C$. The non-inverting output terminal 13a outputs a non-inverted discontinuous pulse signal (Positive) $P_{C-P}$, and the inverting output terminal 13b outputs an inverted discontinuous pulse signal (Negative) $P_{C-N}$. When being outputted from the output terminals 13a and 13b, the positive discontinuous pulse signal $P_{C-P}$ and the negative discontinuous pulse signal $P_{C-N}$ are synchronized with each other (one of the pulse signals is not delayed with respect to the other pulse signal). Of the plurality of transmission lines L1 and L2, the first transmission line L1 is connected to the non-inverting output terminal 13a of the first processor 13, and the second transmission line L2 is connected to the inverting output terminal 13b of the first processor 13.

The line length of the second transmission line L2 is larger than the line length of the first transmission line L1 so as to delay the inverted discontinuous pulse signal $P_{C-N}$ to be transmitted through the second transmission line L2 by a delay amount d with respect to the non-inverted discontinuous pulse signal $P_{C-P}$. As a result, at input ends of the generator 141, the inverted discontinuous pulse signal $P_{C-N}$ is delayed by about the delay amount d with respect to the non-inverted discontinuous pulse signal $P_{C-P}$. The discontinuous pulse signal $P_{C-N}$ thus delayed is referred to as a delayed pulse signal $P_{D-N}$ (refer to FIG. 5B).

The generator 141 generates a short-width pulse signal on the basis of a plurality of input pulse signals. As the plurality of input pulse signals, the non-inverted discontinuous pulse signal $P_{C-P}$ and the delayed pulse signal $P_{D-N}$ are provided to the generator 141. On the basis of the non-inverted discontinuous pulse signal $P_{C-P}$ and the delayed pulse signal $P_{D-N}$, the generator 141 generates a short-width pulse signal $P_S$ having a pulse width $T_{P2}$ according to the delay amount d of the delayed pulse signal $P_{D-N}$ (refer to FIG. 5B). In this embodiment, the generator 141 is constituted by an AND circuit, and generates the short-width pulse signal $P_S$ by performing an AND operation between the non-inverted discontinuous pulse signal $P_{C-P}$ and the delayed pulse signal $P_{D-N}$. It is noted that the generator 141 is not necessarily an AND circuit, and may be any circuit that is able to generate the short-width pulse signal $P_S$ having the pulse width $T_{P2}$ according to the delay amount d of the delayed pulse signal $P_{D-N}$.

Since the delay amount d can be adjusted by the line length of the second transmission line, the short-width pulse signal having a desired pulse width $T_{P2}$ can be easily generated. It is noted that the pulse width $T_{P2}$ of the short-width pulse signal $P_S$ coincides with the delay amount d.

2.5.2 Second Example of Width Reduction Process (Utilizing Delay)

Figure 6A:
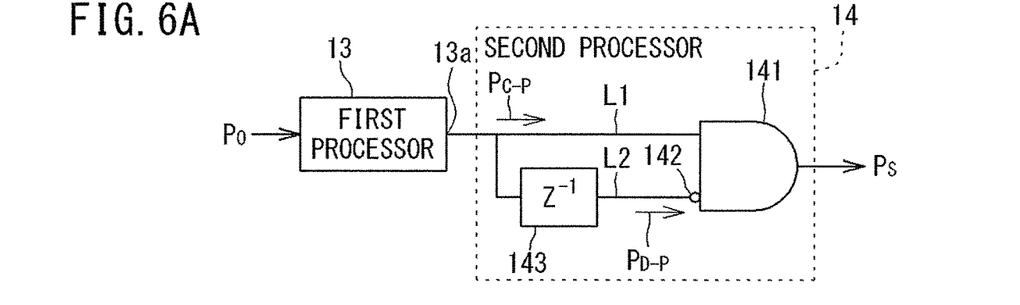
FIG. 6 shows a second example of the second processor.
Figure 6B:
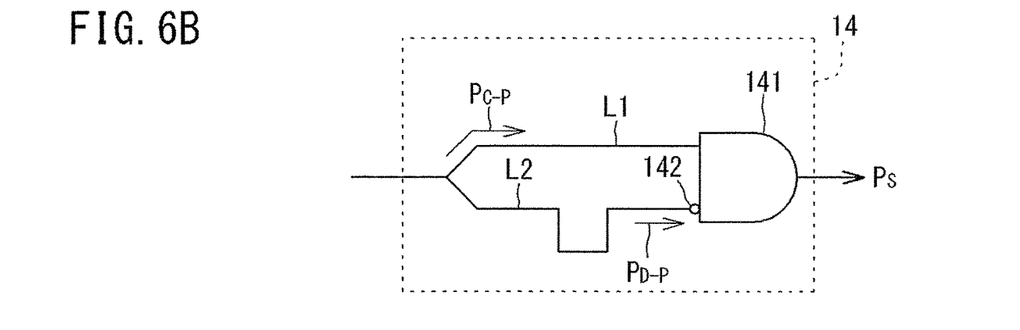

FIGS. 6A and 6B each show a second example of a circuit constituting the second processor 14. Each of the second processors 14 shown in FIGS. 6A and 6B includes a generator 141, and a plurality of (two) transmission lines L1 and L2 that are branched from a single output terminal of the first processor 14 and are connected to the generator 141. The first processor 13 in this example includes a non-inverted (Positive) output terminal 13a as an output terminal that outputs the discontinuous pulse signal $P_C$, and the non-inverting output terminal 13a outputs a non-inverted discontinuous pulse signal (Positive) $P_{C-P}$. The transmission lines L1 and L2 are formed to be branched from the single non-inverting output terminal 13a. Of two input terminals of the generator (AND circuit) 141, an input terminal to which the second transmission line L2 is connected is provided with an inverting element (NOT circuit) 142.

In the second processor 14 shown in FIG. 6A, a delay element 143 is provided in the middle of the second transmission line L2. The delay element 143 enables generation of a (non-inverted) delayed pulse signal $P_{D-P}$ which is obtained by delaying the non-inverted discontinuous pulse signal $P_{C-P}$ transmitted through the second transmission line L2. In the second processor 14 shown in FIG. 6B, the second transmission line L2 is formed to be longer than the first transmission line L1 similarly to the example shown in FIG. 5A. The second transmission line L2 longer than the first transmission line L1 enables generation of a (non-inverted) delayed pulse signal $P_{D-P}$ as in the case of FIG. 6A.

Figure 6C:
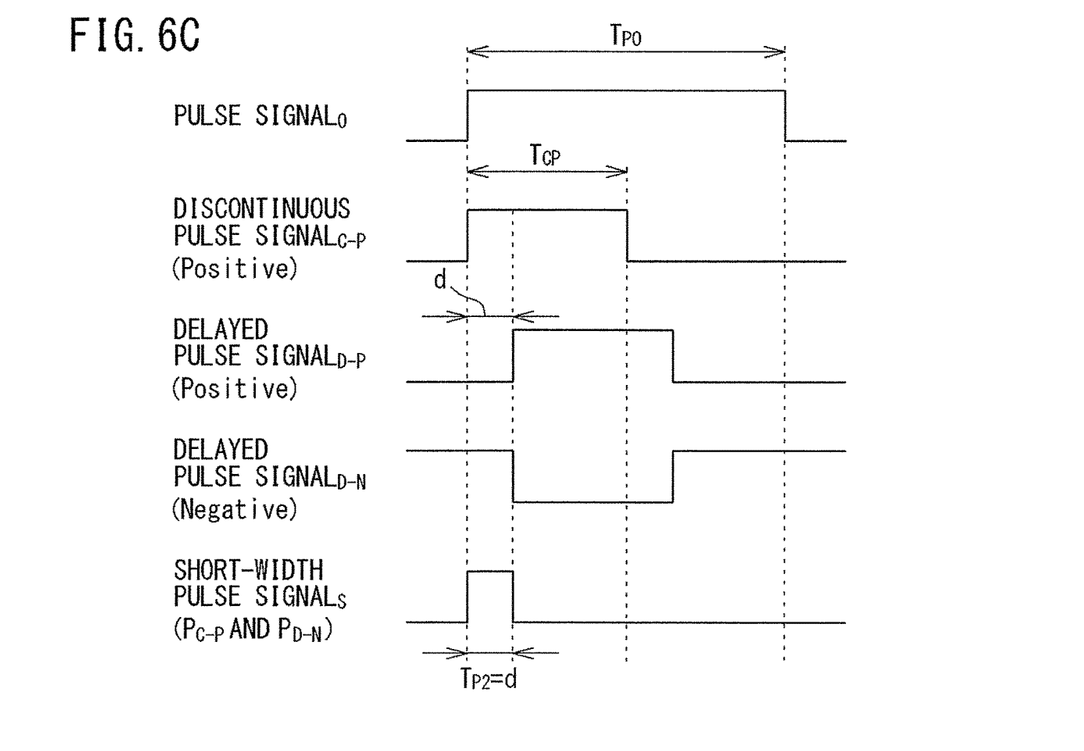

In FIGS. 6A and 6B, the inverting element (NOT circuit) 142 changes the non-inverted delayed pulse signal $P_{D-P}$ to an inverted delayed pulse signal $P_{D-N}$ (refer to FIG. 6C).

The generator 141 generates a short-width pulse signal $P_S$ having a pulse width $T_{P2}$ according to the delay amount d of the delayed pulse signal $P_{D-N}$, on the basis of the non-inverted discontinuous pulse signal $P_{C-P}$ and the inverted delayed pulse signal $P_{D-N}$ (refer to FIG. 6C). For those points not described in the example of FIG. 6, the description made for the example of FIG. 5 is applicable.

2.5.3 Third Example of Width Reduction Process (Utilizing Delay)

Figure 7:
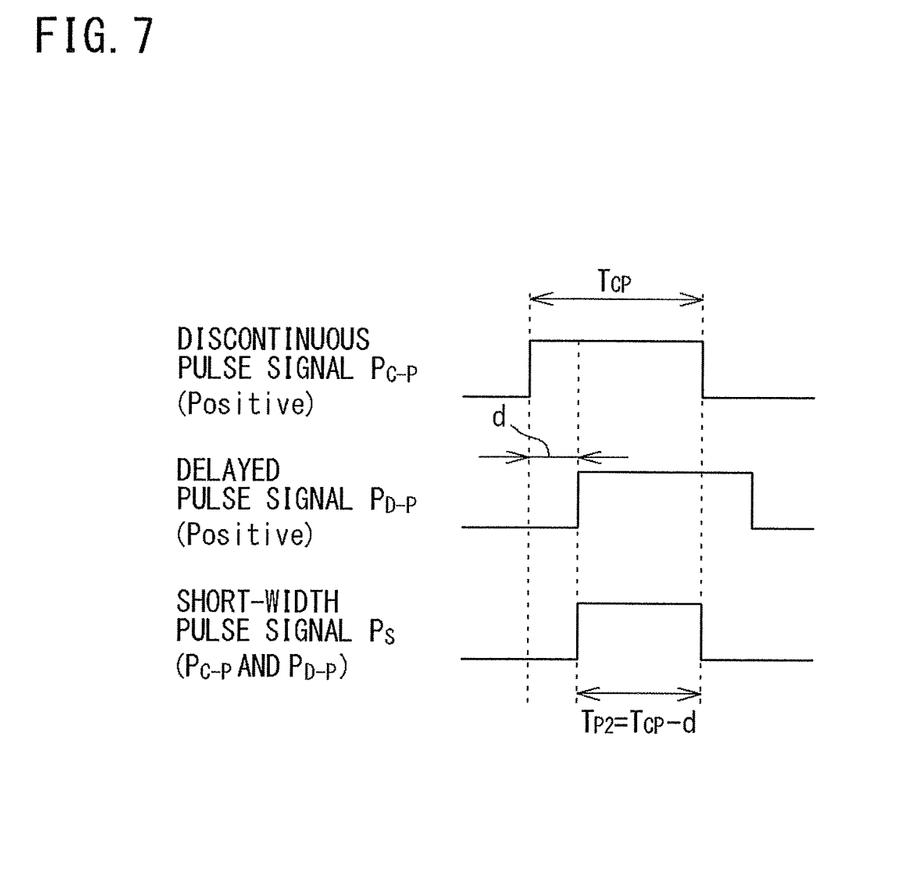
FIG. 7 shows a third example of the second processor.

FIG. 7 shows a third example of the width reduction process performed by the second processor 14. Although an example of a circuit is not shown in FIG. 7, a circuit according to this third example corresponds to the circuit shown in FIG. 6A or 6B from which the inverting element (NOT circuit) 142 is eliminated.

Therefore, the generator 141 according to the third example generates a short-width pulse signal $P_S$ having a pulse width $T_{P2}$ according to the delay amount d of the delayed pulse signal $P_{D-P}$, on the basis of the non-inverted discontinuous pulse signal $P_{C-P}$ and the non-inverted delayed pulse signal $P_{D-P}$. In this example, the pulse width $T_{P2}$ of the short-width pulse signal $P_S$ decreases with an increase in the delay amount d. Specifically, the pulse width $T_{P2}$ of the short-width pulse signal $P_S$ corresponds to the pulse width $T_{CP}$ of the discontinuous pulse signal $P_{C-P}$ from which the delay amount d is subtracted. For those points not described in the example of FIG. 7, the description made for the examples of FIGS. 5 and 6 is applicable.

2.5.4 Variable-Length Transmission Line

Figure 8:
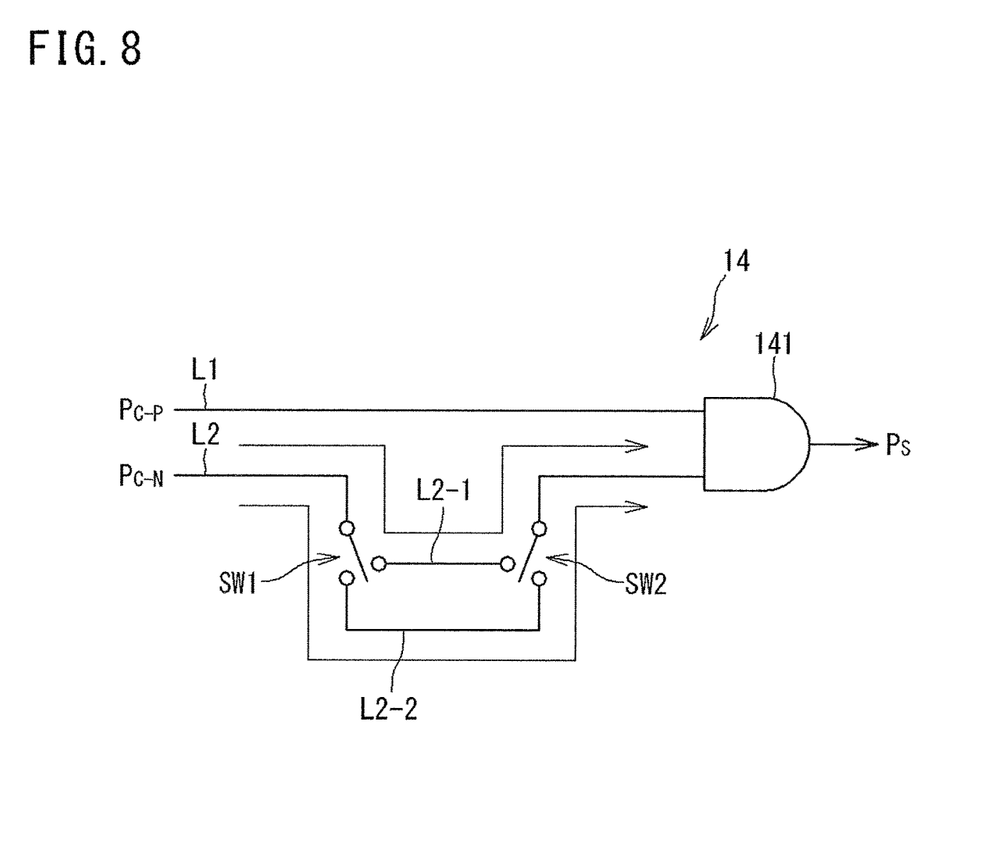
FIG. 8 shows a variable-length transmission line.

FIG. 8 shows a second processor 14 obtained by making the line length of the second transmission line L2 in the example of FIG. 5 variable. In the example of FIG. 8, the second transmission line L2 has, in the middle thereof, a plurality of (two) partial lines L2-1 and L2-2. The partial lines L2-1 and L2-2 have different lengths. The plurality of partial lines L2-1 and L2-2 are alternatively selected by switches SW1 and SW2. The selected partial line constitutes a portion of the second transmission line L2.

When the switches SW1 and SW2 are connected to the first partial line L2-1 side, the second transmission line L2 passes the first partial line L2-1. When the switches SW1 and SW2 are connected to the second partial line L2-2 side, the second transmission line L2 passes the second partial line L2-2. Since the partial lines L2-1 and L2-2 have different lengths, the length of the second transmission line L2 can be changed by switching of the switches SW1 and SW2. When the length of the second transmission line L2 is changed, the delay amount d is changed, whereby the pulse width $T_{P2}$ of the short-width pulse signal $P_S$ can be changed.

When the pulse width $T_{P2}$ of the short-width pulse signal $P_S$ is changed, the extent of the first zone shown in FIG. 3 can be changed. For example, in the case where the frequency $f_{target}$ of the communication signal to be transmitted by the communication device 1 is dynamically changed, the extent of the first zone can be increased so that the frequency $f_{target}$ after changed is included in the first zone. Alternatively, in the case where the present first zone is too wide for the frequency $f_{target}$ after changed, the first zone can be narrowed to an extent sufficient for the frequency $f_{target}$ after changed.

For those points not described in the example of FIG. 8, the description made for the example of FIG. 5 is applicable. In addition, making the line length variable may be applied to the example of FIG. 6B.

2.5.5 Fourth Example of Width Reduction Process (Step-Recovery Diode)

Figure 9A:
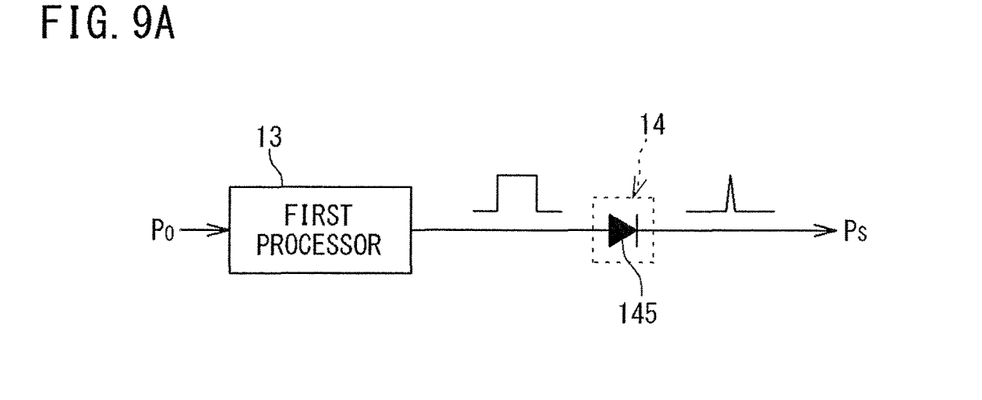
FIG. 9 shows a fourth example of the second processor.
Figure 9B:
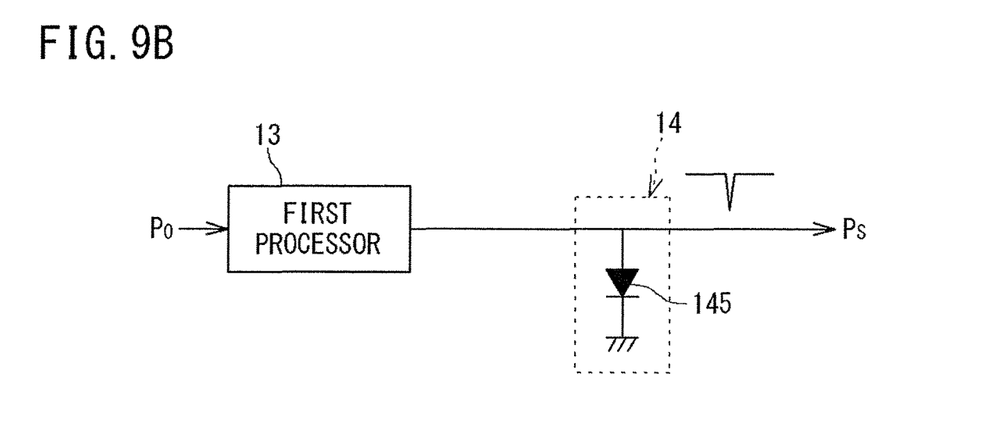

FIGS. 9A and 9B each show a fourth example of a circuit constituting a second processor 14 that performs the width reduction process. Each of the second processors 14 shown in FIGS. 9A and 9B is configured to have a step-recovery diode 145. In the example of FIG. 9A, the step-recovery diode 145 is connected in series to the output of the first processor 13. In the example of FIG. 9B, the step-recovery diode 145 is connected in parallel to the output of the first processor 13. In either of the cases of FIGS. 9A and 9B, the discontinuous pulse signal $P_{C-P}$ generated by the first processor 13 is provided to the step-recovery diode 145.

Figure 9C:
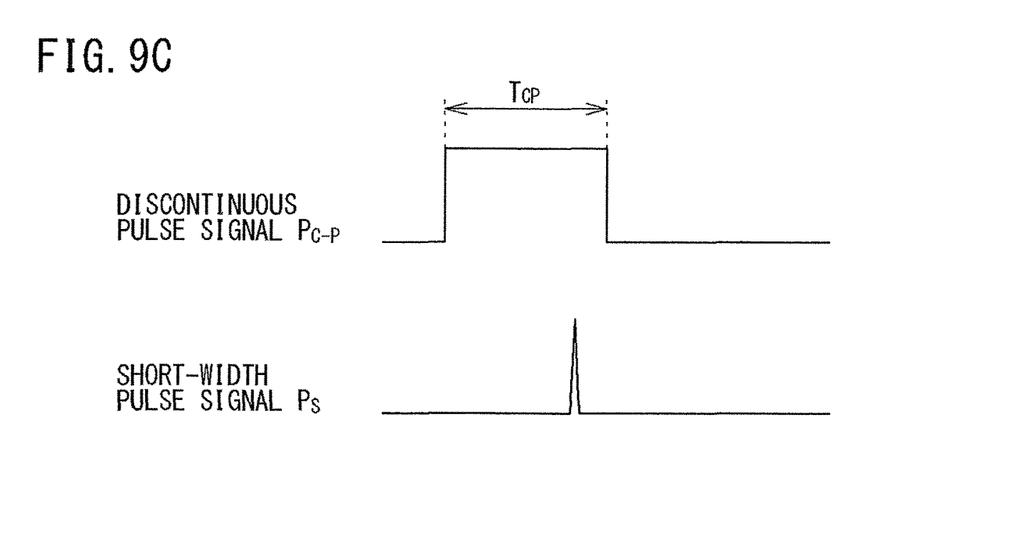

The step-recovery diode 145 is capable of reducing the width of a pulse inputted thereto. In the case of the circuit configuration shown in FIG. 9A, the step-recovery diode 145 can generate a short-width pulse signal $P_S$ as shown in FIG. 9C. Since the pulse height of the short-width pulse signal $P_S$ is higher than that of the original pulse signal $P_O$, reduction in the signal energy can be suppressed. It is noted that the generated short-width pulse signal $P_S$ is inverted in the case of the circuit configuration shown in FIG. 9B.

2.5.6 Fifth Example of Width Reduction Process (Non-Linear Transmission Line)

Figure 10:
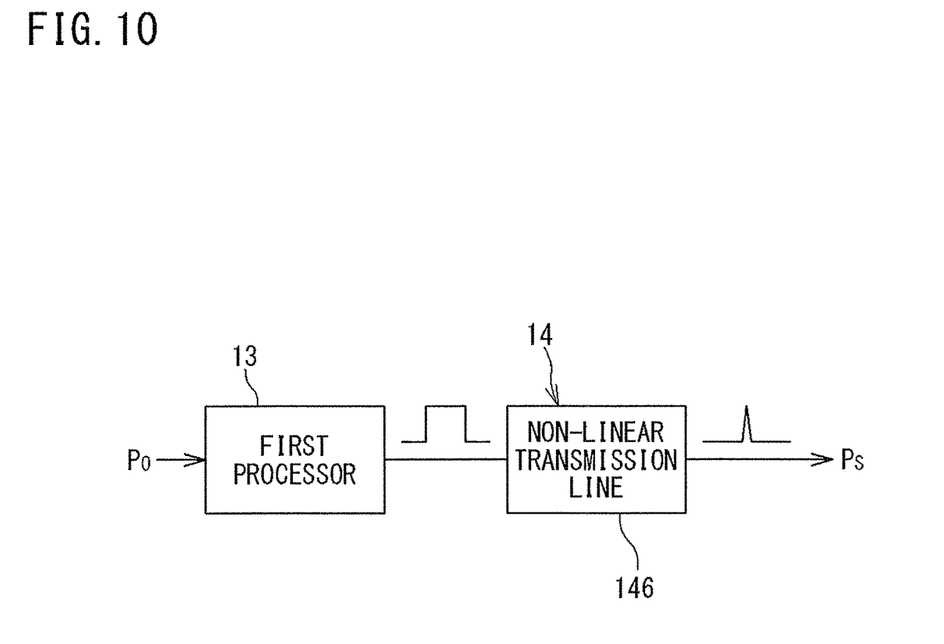
FIG. 10 shows a fifth example of the second processor.

FIG. 10 shows a fifth example of a circuit constituting the second processor 14 that performs the width reduction process. The second processor 14 shown in FIG. 10 is configured to have a non-linear transmission line 146. The non-linear transmission line 146 shortens the pulse width of a pulse signal provided thereto. The non-linear transmission line 146 that shortens the pulse width is commonly used in a generator that generates a pulse signal having a pulse width of about a picosecond, for example.

When the discontinuous pulse signal $P_{C-P}$ generated by the first processor 13 is provided to the non-linear transmission line 146, a short-width pulse signal $P_S$ having a pulse width shorter than that of the discontinuous pulse signal $P_{C-P}$ can be generated. Since the pulse height of this short-width pulse signal $P_S$ is also higher than that of the original pulse signal $P_O$, reduction in the signal energy can be suppressed.

3. Additional Notes

Note that the embodiment disclosed herein is merely illustrative in all aspects and should not be recognized as being restrictive. The scope of the present invention is defined by the scope of the claims rather than by the meaning described above, and is intended to include meaning equivalent to the scope of the claims and all modifications within the scope.

REFERENCE SIGNS LIST 1 communication device
10 signal processing device
11 delta-sigma modulator
12 processor
13 first processor
14 second processor
15 band-pass filter
141 generator
142 inverting element
143 delay element
L1 first transmission line
L2 second transmission line
SW1 switch
SW2 switch

The invention claimed is:
1. A signal processing device comprising:
a delta-sigma modulator configured to output a pulse signal;
a first processor configured to generate, from the pulse signal outputted from the delta-sigma modulator, a discontinuous pulse signal in which each of one-pulse sections in the pulse signal has a low level region on at least one of a rear end and a front end of the one-pulse section; and a second processor configured to generate a short-width pulse signal having a pulse width shorter than a pulse width of the discontinuous pulse signal generated by the first processor.

2. The signal processing device according to claim 1, wherein the second processor includes a generator configured to generate the short-width pulse signal on the basis of a plurality of input pulse signals, the plurality of input pulse signals include the discontinuous pulse signal, and a delayed pulse signal obtained by delaying the discontinuous pulse signal, and the generator generates the short-width pulse signal having a pulse width according to a delay amount of the delayed pulse signal.

3. The signal processing device according to claim 2, wherein one of the discontinuous pulse signal and the delayed pulse signal is inverted with respect to the other pulse signal.

4. The signal processing device according to claim 2, wherein the second processor further includes
a first transmission line configured to provide the discontinuous pulse signal to the generator, and
a second transmission line configured to provide the delayed pulse signal to the generator, and
the second transmission line has a line length larger than that of the first transmission line.

5. The signal processing device according to claim 4, wherein the second transmission line is configured to have a variable line length.

6. The signal processing device according to claim 2, wherein the second processor further includes
a first transmission line configured to provide the discontinuous pulse signal to the generator, and
a second transmission line configured to provide the delayed pulse signal to the generator, and
the second transmission line has a delay element.

7. The signal processing device according to claim 1, wherein the second processor includes a step-recovery diode to which the discontinuous pulse signal generated by the first processor is provided.

8. The signal processing device according to claim 1, wherein the second processor includes a transmission line to which the discontinuous pulse signal generated by the first processor is provided, and the transmission line is a non-linear transmission line configured to shorten the pulse width of the discontinuous pulse signal provided thereto.

9. The signal processing device according to claim 1, wherein the pulse width of the short-width pulse signal generated by the second processor is larger than or equal to $1/10$ of the pulse width of the pulse signal outputted from the delta-sigma modulator.

10. A communication device including the signal processing device according to claim 1.

11. A signal processing device comprising:

a delta-sigma modulator configured to output a pulse signal;

a first processor configured to generate, from the pulse signal outputted from the delta-sigma modulator, a discontinuous pulse signal in which each of one-pulse sections in the pulse signal has a low level region on at least one of a rear end and a front end of the one-pulse section; and a second processor, wherein
the second processor includes
a generator configured to generate a short-width pulse signal,
a first transmission line configured to provide the discontinuous pulse signal to the generator, and
a second transmission line configured to provide a delayed pulse signal obtained by delaying the discontinuous pulse signal to the generator,
the generator generates the short-width pulse signal on the basis of the discontinuous pulse signal and the delayed pulse signal, and
the second transmission line has a line length larger than that of the first transmission line.

12. A communication device including the signal processing device according to claim 11.

* * * * *